(12) United States Patent
Lin et al.

(10) Patent No.: US 12,685,141 B2
(45) Date of Patent: Jul. 14, 2026

(54) SEMICONDUCTOR STRUCTURE AND FABRICATION METHOD THEREOF

(71) Applicant: UNITED MICROELECTRONICS CORP., Hsin-Chu City (TW)

(72) Inventors: Da-Jun Lin, Kaohsiung City (TW); Chih-Wei Chang, Tainan City (TW); Fu-Yu Tsai, Tainan City (TW); Bin-Siang Tsai, Changhua County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 461 days.

(21) Appl. No.: 18/136,888

(22) Filed: Apr. 20, 2023

(65) Prior Publication Data

US 2024/0332066 A1     Oct. 3, 2024

(30) Foreign Application Priority Data

Mar. 28, 2023     (CN) .......................... 202310311761.8

(51) Int. Cl.
H01L 21/768 (2006.01)
H01L 23/532 (2006.01)

(52) U.S. Cl.
CPC .... H01L 21/7682 (2013.01); H01L 21/76832 (2013.01); H01L 23/53238 (2013.01)

(58) Field of Classification Search
CPC ........... H01L 21/7682; H01L 21/76834; H01L 21/76832; H01L 23/5222; H01L 23/53238
See application file for complete search history.

(56) References Cited

U.S. PATENT DOCUMENTS

| | | | |
|---|---|---|---|
| 7,868,455 B2 | 1/2011 | Chen | |
| 10,157,778 B2 | 12/2018 | Tsai | |
| 10,211,146 B2 | 2/2019 | He | |
| 10,411,107 B2* | 9/2019 | Schutz | H10D 64/021 |
| 2013/0072018 A1* | 3/2013 | Schaller | H01L 21/76826 |
| | | | 257/E21.585 |
| 2017/0330790 A1* | 11/2017 | He | H01L 23/66 |
| 2017/0358482 A1* | 12/2017 | Chen | H01L 21/76883 |
| 2020/0127110 A1* | 4/2020 | Lee | H10D 64/254 |
| 2021/0327813 A1* | 10/2021 | Singh | H01L 21/7682 |

OTHER PUBLICATIONS

Zhang, the specification, including the claims, and drawings in the U.S. Appl. No. 17/868,786, filed Jul. 20, 2022.

* cited by examiner

*Primary Examiner* — John M Parker
(74) *Attorney, Agent, or Firm* — Winston Hsu

(57) ABSTRACT
A semiconductor structure includes a substrate; a first dielectric layer on the substrate; an etch stop layer on the first dielectric layer; a second dielectric layer on the etch stop layer; a first conductor and a second conductor in the second dielectric layer, an air gap in the second dielectric layer and between the first conductor and the second conductor; and a low-polarity dielectric layer on a sidewall surface of the second dielectric layer within the air gap.

9 Claims, 4 Drawing Sheets

SEMICONDUCTOR STRUCTURE AND FABRICATION METHOD THEREOF

BACKGROUND OF THE INVENTION

1. Field of the Invention

The present invention relates to the field of semiconductor technology, in particular to a semiconductor structure with an air gap.

2. Description of the Prior Art

The dielectric constant of dielectric films in semiconductor fabrication is continually decreasing as device scaling continues. Minimizing integration damage on low dielectric constant (low-k) films is important to be able to continue decreasing feature sizes.

Porous low-k dielectric films, for example, organo-silicate glass (OSG) based low-k dielectric films suffer plasma damages after going through air gap etching process, which leads to larger resistive-capacitive (RC) delay.

SUMMARY OF THE INVENTION

It is one object of the present invention to provide an improved interconnect structure in order to solve the deficiencies or shortcomings of the prior art.

One aspect of the invention provides a semiconductor structure including a substrate; a first dielectric layer on the substrate; an etch stop layer on the first dielectric layer; a second dielectric layer on the etch stop layer; a first conductor and a second conductor in the second dielectric layer; an air gap in the second dielectric layer and between the first conductor and the second conductor; and a first low-polarity dielectric layer on a sidewall surface of the second dielectric layer within the air gap.

According to some embodiments, the first dielectric layer is a silicon oxide layer and the second dielectric layer is a low-dielectric constant (low-k) material layer.

According to some embodiments, the low-k material layer comprises organo-silicate glass (OSG) based low-k dielectric layer.

According to some embodiments, the first low-polarity dielectric layer is a silylated surface layer.

According to some embodiments, the semiconductor structure further includes a second low-polarity dielectric layer disposed around the first conductor; and a third low-polarity dielectric layer disposed around the second conductor.

According to some embodiments, the second and third low-polarity dielectric layers are silylated surface layers.

According to some embodiments, the second low-polarity dielectric layer is in direct contact with the first conductor, and the third low-polarity dielectric layer is in direct contact with the second conductor.

According to some embodiments, the first conductor and the second conductor comprise copper.

According to some embodiments, the air gap extends into the etch stop layer and the first dielectric layer.

According to some embodiments, the semiconductor structure further includes a silylated oxide surface layer on a sidewall surface of the first dielectric layer.

Another aspect of the invention provides method for forming a semiconductor structure includes the steps of providing a substrate; forming a first dielectric layer on the substrate; forming an etch stop layer on the first dielectric layer; forming a second dielectric layer on the etch stop layer; forming a first conductor and a second conductor in the second dielectric layer; forming an air gap in the second dielectric layer and between the first conductor and the second conductor; and forming a first low-polarity dielectric layer on a sidewall surface of the second dielectric layer within the air gap.

According to some embodiments, the first dielectric layer is a silicon oxide layer and the second dielectric layer is a low-dielectric constant (low-k) material layer.

According to some embodiments, the low-k material layer comprises organo-silicate glass (OSG) based low-k dielectric layer.

According to some embodiments, the first low-polarity dielectric layer is a silylated surface layer.

According to some embodiments, the method further includes the steps of forming a second low-polarity dielectric layer around the first conductor; and forming a third low-polarity dielectric layer around the second conductor.

According to some embodiments, the second and third low-polarity dielectric layers are silylated surface layers.

According to some embodiments, the second low-polarity dielectric layer is in direct contact with the first conductor, and the third low-polarity dielectric layer is in direct contact with the second conductor.

According to some embodiments, the first conductor and the second conductor comprise copper.

According to some embodiments, the air gap extends into the etch stop layer and the first dielectric layer.

According to some embodiments, the method further includes the step of forming a silylated oxide surface layer on a sidewall surface of the first dielectric layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
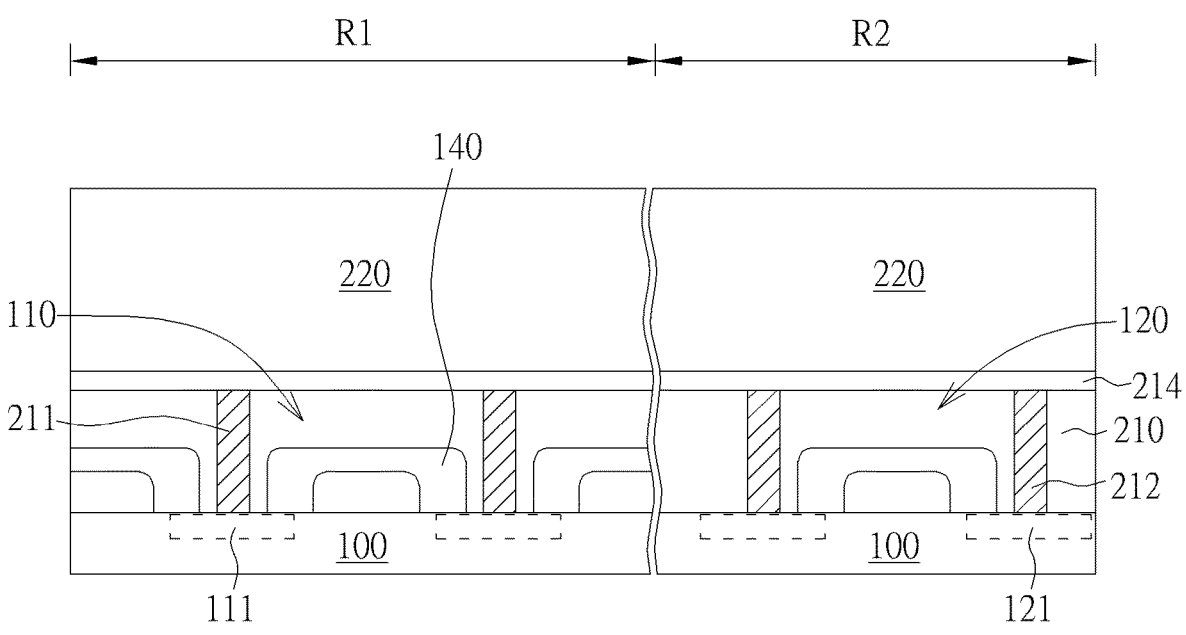
FIG. 1 to FIG. 7 are schematic diagrams illustrating a method for forming a semiconductor structure according to an embodiment of the present invention.

Please refer to FIG. 1 to FIG. 7, which are schematic diagrams of a method for forming a semiconductor structure according to an embodiment of the present invention. As shown in FIG. 1, a substrate 100 is provided, such as a silicon substrate, on which a circuit region R1 and a circuit region R2 are provided. According to an embodiment of the present invention, at least one transistor 110 is formed in the circuit region R1, and at least one transistor 120 is formed in the circuit region R2. Transistor 110 and transistor 120 may be covered by a contact etch stop layer 140 and a dielectric layer 210. For example, the contact etch stop layer 140 may be a silicon nitride layer, but is not limited thereto. Conductive contacts 211 and 212 such as tungsten contacts are further formed in the dielectric layer 210, which are electrically connected to the source or drain region 111 of the transistor 110 and the source or drain region 121 of the transistor 120, respectively.

Subsequently, an etch stop layer 214, such as a silicon nitride layer, is formed on the dielectric layer 210, and then a dielectric layer 220 is formed on the etch stop layer 214. According to an embodiment of the present invention, for example, the dielectric layer 210 may be a silicon oxide layer, and the dielectric layer 220 may be a low-k material layer, but not limited thereto. According to an embodiment of the present invention, for example, the aforementioned low-k material layer may include an organo-silicate glass (OSG) based low-k dielectric layer.

Figure 2:
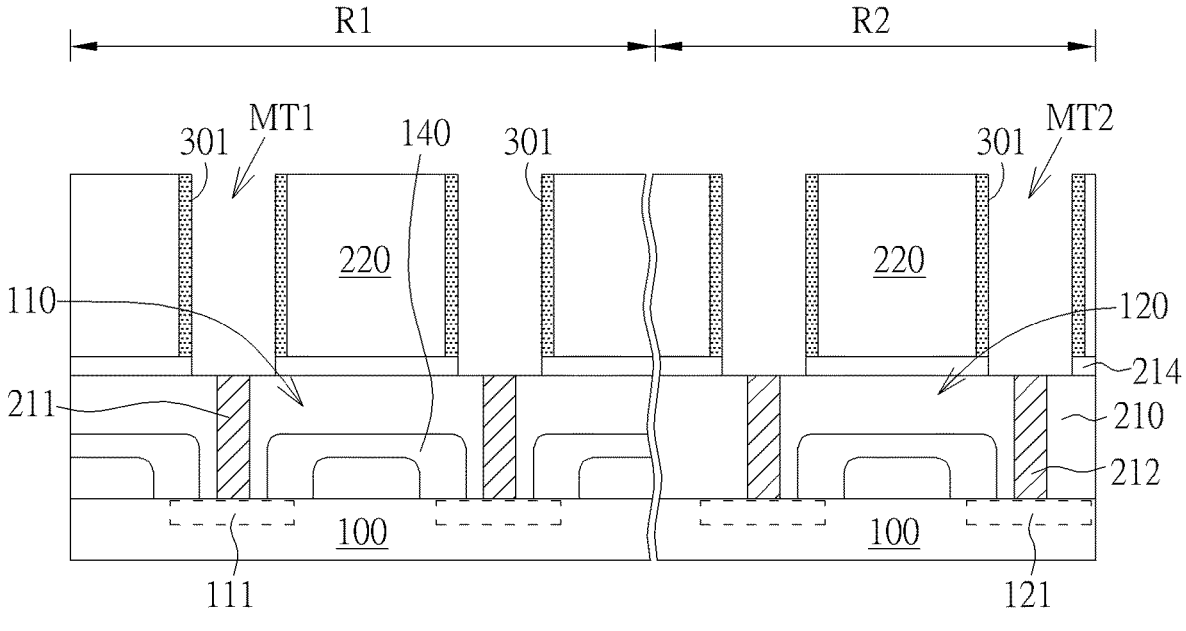

As shown in FIG. 2, a photolithography process and an etching process are then performed to form trenches MT1 and trenches MT2 in the dielectric layer 220 and the etch stop layer 214 in the circuit region R1 and the circuit region R2, respectively. During the above etching process, an etching damage surface layer 301 will be formed on the surface of the dielectric layer 220 in the trenches MT1 and the trenches MT2. The etching damage surface layer 301 is formed because that the O—Si—CH3 bonding structure in the dielectric layer 220, which has lower polarity and dielectric constant, is changed to Si—O or Si—OH, which has higher polarity and dielectric constant, which affect the performance of integrated circuits. The present invention addresses this issue.

Figure 3:
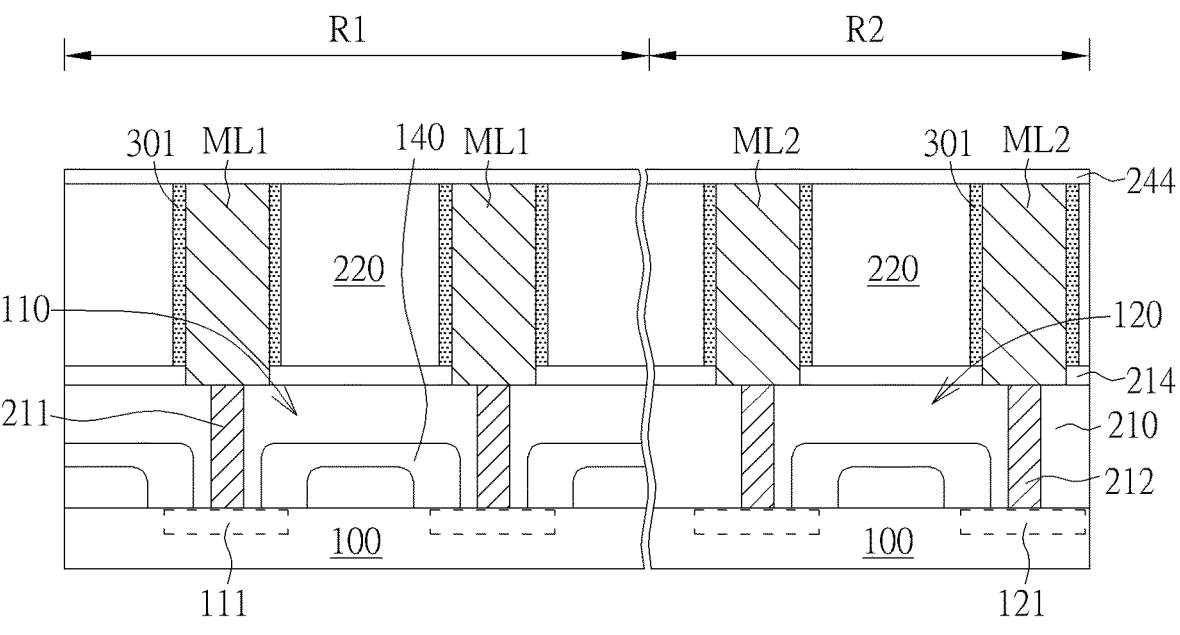

As shown in FIG. 3, a metallization process, including, but not limited to, an electroplating process and a chemical mechanical polishing (CMP) process, is then performed to form conductors ML1 and ML2 in the trenches MT1 and MT2 in the dielectric layer 220, respectively. According to an embodiment of the present invention, for example, the conductors ML1 and ML2 may comprise copper. An etch stop layer 244 including, but not limited to, a nitrogen-doped silicon carbide layer is formed on the dielectric layer 210 and the conductors ML1 and ML2.

Figure 4:
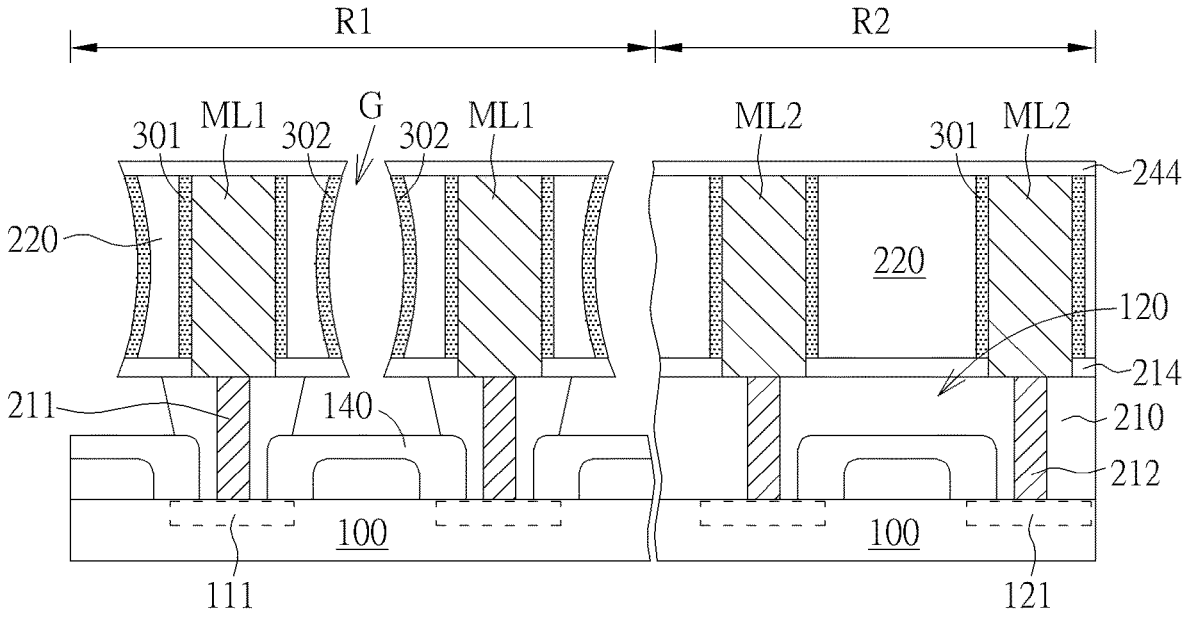

As shown in FIG. 4, a photolithography process and an etching process are performed to form an air gap G between the conductors ML1 in the dielectric layer 220 in the circuit region R1. No air gap is formed in the dielectric layer 220 in the circuit region R2. According to an embodiment of the present invention, for example, the above-described etching process may include a dry etching process and a wet etching process, so as to increase the width of the air gap G laterally. According to an embodiment of the present invention, the air gap G may further extend into the etch stop layer 214 and the dielectric layer 210, partially exposing the contact etch stop layer 140 covering the transistor 110. At this point, an etching damage surface layer 302 is formed on the surface of the dielectric layer 220 in the air gap G. The etch damage surface layer 302 is formed because that the O—Si—CH3 bonding structure in the dielectric layer 220, which has lower polarity and dielectric constant, is changed to Si—O or Si—OH, which has higher polarity and dielectric constant, which affects the performance of integrated circuits.

Figure 5:
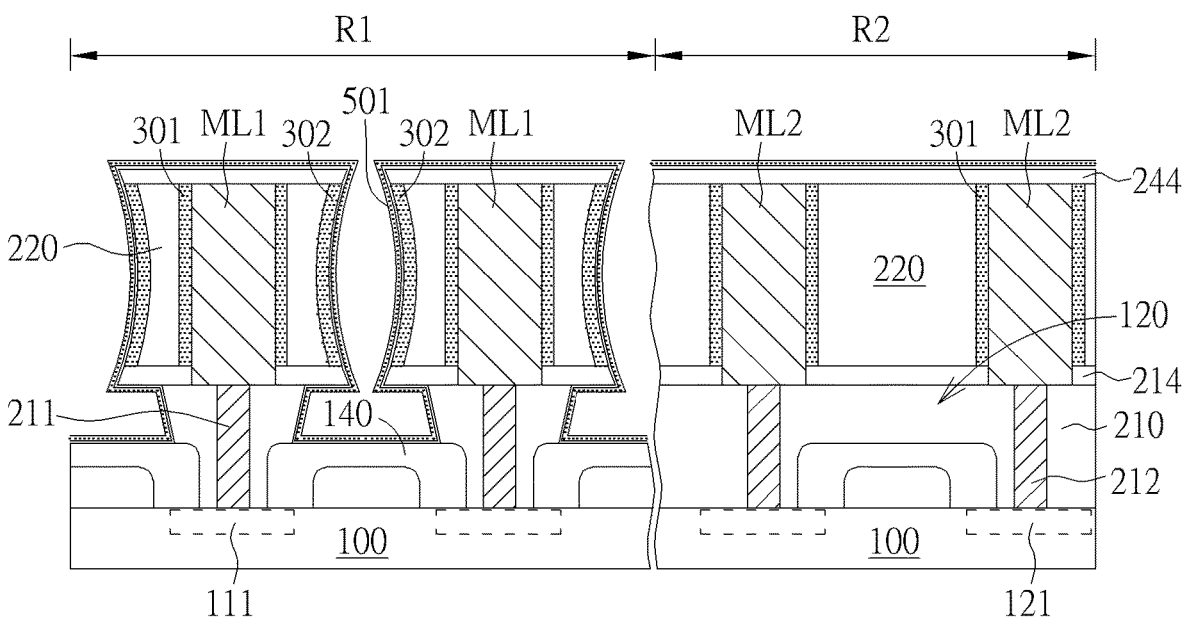

As shown in FIG. 5, a surface plasma activation process may be optionally performed, so that the plasma gas contacts the surface of the air gap G to form a Si—OH rich surface layer 501.

Figure 6:
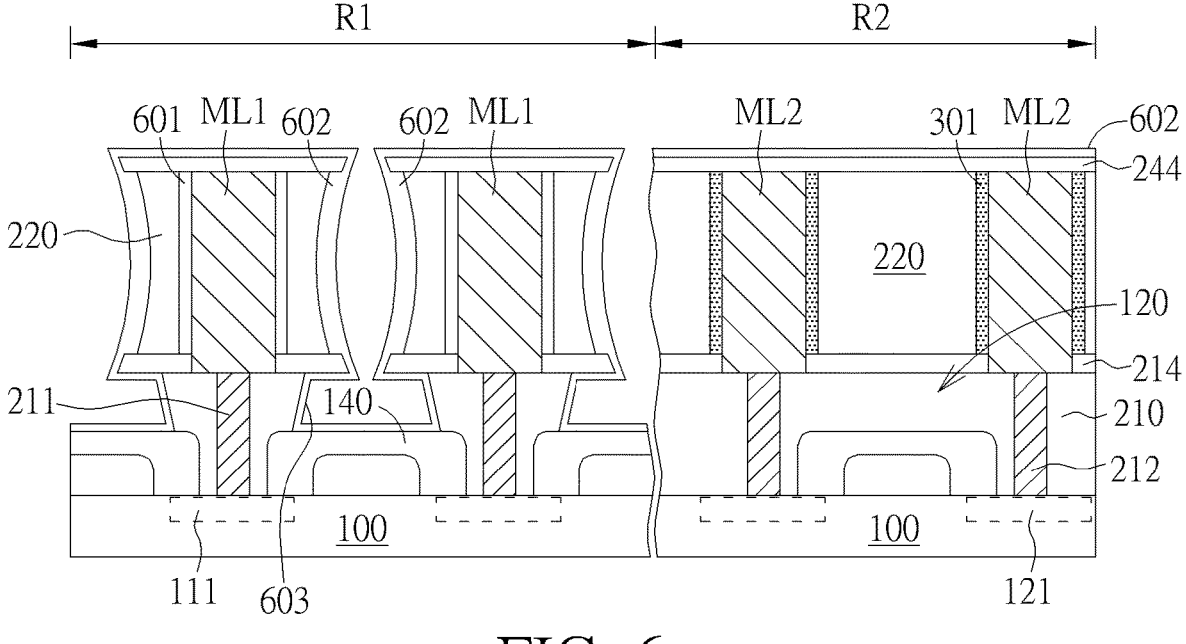

As shown in FIG. 6, using hexamethyldisilazane (HMDS) to carry out silylation, on the sidewall surface of the dielectric layer 220 in the air gap G, the etching damage surface layer 302 is transformed into a low-polarity dielectric layer 602. According to an embodiment of the present invention, HMDS molecules can also pass through the pores in the dielectric layer 220 to transform the etching damaged surface layer 301 into a low-polarity dielectric layer 601 around the conductor ML1. According to an embodiment of the present invention, the low-polarity dielectric layers 601 and 602 are silylated surface layers, and the structure of which is close to or identical to that of the dielectric layer 220, and thus has low-k characteristics. According to an embodiment of the present invention, the low-polarity dielectric layer 601 is in direct contact with the conductor ML1. According to an embodiment of the present invention, a silylated oxide surface layer 603 may also be formed on the sidewall surface of the dielectric layer 210.

Figure 7:
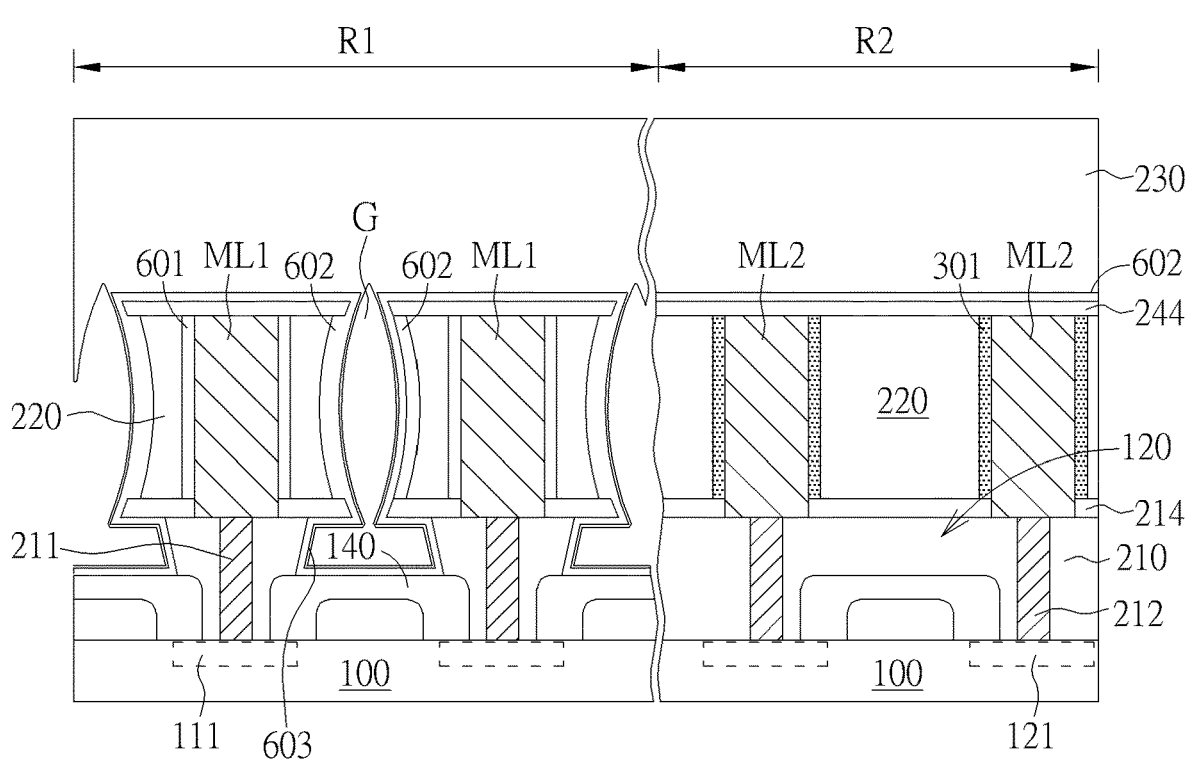

As shown in FIG. 7, a chemical vapor deposition (CVD) process or other processes are then performed to deposit a dielectric layer 230 on the circuit region R1 and the circuit region R2 in a blanket manner, thereby forming sealed air gaps G. According to an embodiment of the present invention, the dielectric layer 220 may be a low-k material layer, but is not limited thereto. Subsequently, the metallization process may be continued to form a back-end metal interconnect structure.

Figure 8:
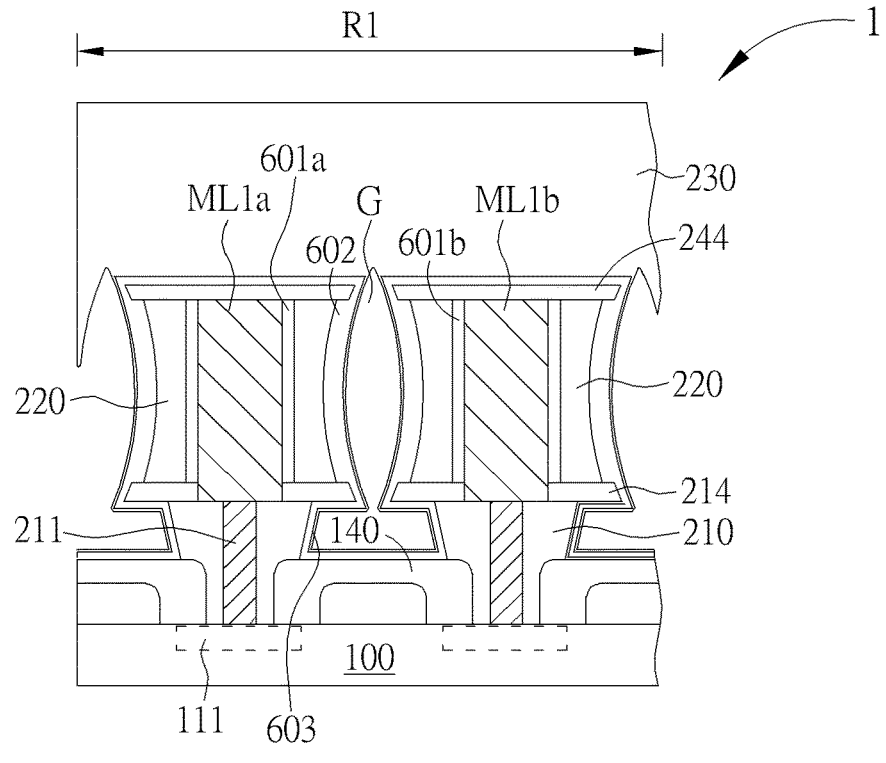
FIG. 8 illustrates a partial view of the semiconductor structure according to an embodiment of the invention.

Please refer to FIG. 8, which illustrates a partial view of a semiconductor structure according to an embodiment of the present invention, wherein the same or similar elements, regions or layers are still designated by the same numeral numbers or labels. As shown in FIG. 8, the semiconductor structure 1 includes: a substrate 100; a dielectric layer 210 located on the substrate 100; an etch stop layer 214 located on the dielectric layer 210; a dielectric layer 220 located on the etch stop layer 214; adjacent conductor ML1*a* and conductor ML1*b* located in the dielectric layer 220; an air gap G located in the dielectric layer 220 and between the conductor ML1*a* and the conductor ML1*b*; and a low-polarity dielectric layer 602 located in the air gap G on the sidewall surface of the dielectric layer 220.

According to an embodiment of the present invention, the dielectric layer 210 is a silicon oxide layer, and the dielectric layer 220 is a low-k material layer, including, but not limited to, an organo-silicate glass (OSG) based low-k dielectric layer or other porous materials. According to an embodiment of the present invention, the low-polarity dielectric layer 602 is a silylated surface layer.

According to an embodiment of the present invention, the semiconductor structure 1 further includes a low-polarity dielectric layer 601*a* disposed around the conductor ML1*a*; and a low-polarity dielectric layer 601*b* disposed around the conductor ML1*b*. According to an embodiment of the present invention, the low-polarity dielectric layer 601*a* and the low-polarity dielectric layer 601*b* are silylated surface layers. According to an embodiment of the present invention, the low-polarity dielectric layer 601*a* is in direct contact with the conductor ML1*a*, and the low-polarity dielectric layer 601*b* is in direct contact with the conductor ML1*b*. According to an embodiment of the present invention, the conductor ML1*a* and the conductor ML1*b* include copper.

According to an embodiment of the invention, the air gap G extends into the etch stop layer 214 and the dielectric layer 210. According to an embodiment of the present invention, the semiconductor structure 1 further includes a silylated oxide surface layer 603 located on the sidewall surface of the dielectric layer 210 in the air gap G.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate;
a first dielectric layer on the substrate;
an etch stop layer on the first dielectric layer;
a second dielectric layer on the etch stop layer;
a first conductor and a second conductor in the second dielectric layer;
an air gap in the second dielectric layer and between the first conductor and the second conductor;
a first low-polarity dielectric layer on a sidewall surface of the second dielectric layer within the air gap;
a second low-polarity dielectric layer disposed around the first conductor; and
a third low-polarity dielectric layer disposed around the second conductor.

2. The semiconductor structure according to claim 1, wherein the first dielectric layer is a silicon oxide layer and the second dielectric layer is a low-dielectric constant (low-k) material layer.

3. The semiconductor structure according to claim 2, wherein the low-k material layer comprises organo-silicate glass (OSG) based low-k dielectric layer.

4. The semiconductor structure according to claim 1, wherein the first low-polarity dielectric layer is a silylated surface layer.

5. The semiconductor structure according to claim 1, wherein the second and third low-polarity dielectric layers are silylated surface layers.

6. The semiconductor structure according to claim 1, wherein the second low-polarity dielectric layer is in direct contact with the first conductor, and the third low-polarity dielectric layer is in direct contact with the second conductor.

7. The semiconductor structure according to claim 1, wherein the first conductor and the second conductor comprise copper.

8. The semiconductor structure according to claim 1, wherein the air gap extends into the etch stop layer and the first dielectric layer.

9. The semiconductor structure according to claim 8 further comprising:
a silylated oxide surface layer on a sidewall surface of the first dielectric layer.

* * * * *